United States Patent
Butera et al.

[11] Patent Number: 6,127,196
[45] Date of Patent: Oct. 3, 2000

[54] METHOD FOR TESTING A TAPE CARRIER PACKAGE

[75] Inventors: Richard R. Butera, Palo Alto; William A. Huffman, Aptos, both of Calif.

[73] Assignee: Intel Corporation, Santa Clara, Calif.

[21] Appl. No.: 09/069,273

[22] Filed: Apr. 29, 1998

Related U.S. Application Data

[62] Division of application No. 08/536,855, Sep. 29, 1995, abandoned.

[51] Int. Cl.[7] .................................................. G01R 31/26
[52] U.S. Cl. ............................. 438/15; 438/18; 324/365
[58] Field of Search ............................. 438/15, 17, 18; 324/765, 755

[56] References Cited

U.S. PATENT DOCUMENTS

| | | | |
|---|---|---|---|
| 4,575,747 | 3/1986 | Fritz | 357/70 |
| 4,772,936 | 9/1988 | Reding et al. | 357/80 |
| 4,783,719 | 11/1988 | Jamison et al. | 361/398 |
| 4,806,409 | 2/1989 | Walter et al. | 428/138 |
| 4,903,113 | 2/1990 | Frankeny et al. | 357/70 |
| 4,949,158 | 8/1990 | Ueda | 257/774 |
| 4,980,219 | 12/1990 | Hiraide et al. | 428/134 |
| 5,008,614 | 4/1991 | Shreeve et al. | 324/158 |
| 5,086,335 | 2/1992 | Leibovitz et al. | 357/70 |
| 5,121,053 | 6/1992 | Shreeve et al. | 324/158 |
| 5,189,363 | 2/1993 | Bregman et al. | 324/158 |
| 5,221,858 | 6/1993 | Higgins, III | 257/666 |
| 5,355,105 | 10/1994 | Angelucci, Sr. | 333/238 |
| 5,572,140 | 11/1996 | Lim et al. | 324/755 |
| 5,677,203 | 10/1997 | Rates | 438/15 |

*Primary Examiner*—John F. Niebling
*Assistant Examiner*—John Murphy
*Attorney, Agent, or Firm*—Blakely, Sokoloff, Taylor & Zafman LLP

[57] ABSTRACT

Methods for testing a [A] tape carrier package (TCP) for an integrated circuit device that includes two sets of test pads. A first set of test pads are located along the outer edges of the TCP and are used to test the performance of the integrated circuit device once the TCP has been fabricated and assembled. A second set of test pads is also provided between the TCP outer leads and integrated circuit device for testing the performance of the device once the TCP has been removed from a printed circuit board.

1 Claim, 6 Drawing Sheets

METHOD FOR TESTING A TAPE CARRIER PACKAGE

This is a divisional of application No. 08/536,855, filed Sep. 29, 1995, now abandoned.

FIELD OF THE INVENTION

The present invention relates to Tape Carrier Packaging. More specifically, the invention provides electrical contact pads on a Tape Carrier Package (TCP) to facilitate the failure analysis testing of a TCP after it has been removed from a printed circuit board.

BACKGROUND OF THE INVENTION

Tape Automated Bonding (TAB) is a process that is used to interconnect a chip to a package. The TAB process involves bonding an integrated circuit (IC) device to a patterned metal on a polymer tape which typically consists of copper foil on a polyimide tape. Once the IC device is bonded to the tape the apparatus is commonly referred to as a Tape Carrier Package (TCP).

FIG. 1 illustrates the backside of a typical prior art TCP 10 as assembled and tested before it is shipped to a customer. As shown in FIG. 1, the copper on the TCP 10 is patterned to form electrically conductive leads 14 that are used for supplying power, grounding, and exchanging signals between IC device 12 and a substrate, such as a printed circuit board (PCB). Inner leads 14a are bonded to pads (not shown) located on the opposing side of IC device 12. Test pads 16 are also provided along the outer periphery of TCP 10 to facilitate the electrical testing of IC device 12 before the TCP is shipped to the customer. The metallurgy of leads 14 and contact pads 16 typically consists of copper that is gold plated over a nickel flash. Note also that sprocket holes 9 are used to position the TCP throughout the manufacture and assembly processes.

With continuing reference to FIG. 1, outer lead bonding windows 18 represent those portions of the TCP where the polyimide tape 8 has been removed to expose outer leads 14b. Bonding windows 18 are provided to facilitate the bonding of outer leads 14b to the electrical contact pads on a PCB (not shown). As mentioned above, when the electrical testing of IC device 12 is complete the TCP is shipped to the customer. Using specialized equipment the customer trims the TCP along either lines A—A or B—B and subsequently mounts the TCP to a PCB.

Referring to FIG. 2a and FIG. 2b, the TCP of FIG. 1 is shown trimmed along lines A—A and B—B, respectively. During the trimming process outer leads 14b are trimmed as depicted in FIGS. 2a and 2b. Note that test pads 16 are removed and discarded by the customer during the TCP trimming process. After the TCP is trimmed it is reflowed onto the PCB (not shown) by one of several methods including hot bar, hot gas, or laser reflow. In general, the reflow process includes bonding the TCP to the electrical contact pads of the PCB by heating and forcing the outer leads against the solder coated bonding pads of the PCB (not shown). FIG. 3 illustrates the TCP of FIG. 2a after the outer lead bonding procedure is complete. As shown in FIG. 3, outer leads 14b are bonded to pads 23 of PCB 22.

Once a TCP has been mounted to a PCB problems may arise in the performance of the IC device. In these instances the TCP must be removed from the PCB so that the IC device may be tested to verify its performance. In order to remove the TCP from the PCB the TCP outer lead and the PCB contact pad interfaces are heated to reflow the solder connection between the TCP and PCB. The TCP can then be carefully removed from the PCB using one of a number of techniques. One such technique includes the use of a suction device that attaches itself to the TCP and lifts it from the PCB surface. Once removed, the TCP is remounted to either an interposer circuit board, a daughter board, or similar type device, where it undergoes failure analysis testing. Mounting the TCP onto the interposer circuit board requires that each outer lead of the TCP be soldered to corresponding pads on the surface of the board.

As integrated circuits and circuit board technology has improved, substantially greater functionality has been incorporated into modern integrated circuits. In addition, the portability of computing and information management is driving the reduction in size from desktop to laptop to notebook to palm top sized products. These products, such as notebook computing systems, require lightweight small footprint integrated circuits. Consequently, as integrated circuits have expanded in functionality the number of leads required to effectively communicate with these devices has greatly increased while the size of the devices have diminished. For example, Intel Corporation has recently introduced IC devices requiring TCP component packages having outer lead pitches as low as 0.2 mm.

The extremely fine pitch lead devices being fabricated today have made it increasingly more difficult to remove and test the devices after they have been mounted and reflowed onto a PCB. Using even the best of techniques to remove the TCP from a PCB inevitably results in lead damage and shorts between the metal coated leads. As a consequence, many of the leads must be repaired and individually realigned before they are remounted to an interposer circuit board for failure analysis testing. Moreover, the mounting of a TCP onto an interposer circuit board requires that each outer lead of the TCP be soldered to corresponding pads on the surface of the interposer board. This procedure is labor intensive and requires that personnel be specially trained in the attachment process. More importantly, since it is difficult to verify the integrity of each lead attachment to the interposer board, the reliability of the failure analysis test is compromised. In fact, in those instances where the outer leads have received extensive damage during the removal of the TCP from the PCB, the testing of the IC device may be precluded altogether using current post mount testing techniques.

Another problem associated with current TCP designs involves the location of test pads 16 as depicted in FIG. 1. As clocking frequencies continue to increase the ability to test IC devices has become increasingly more difficult because of the electrical switching noise that results from the high speed switching operations of the IC device. Having test pads 16 located at the outer periphery of TCP 10 contributes to the switching noise problem by effectively maximizing the impedance between the test pads and the IC device.

What is needed then is a solution to the problems inherent in the prior art. As will be seen, the present invention provides an improved TCP that solves the aforementioned problems.

SUMMARY OF THE INVENTION

The present invention is an apparatus and method that provides an improved interface for testing the IC device on a TCP after the TCP has been removed from a PCB.

In one embodiment, the present invention includes a method for testing a TCP having an integrated circuit device and a tape in which a plurality of leads are formed. Each of the plurality of leads has an inner lead and an outer lead and two electrical contact pads integrally formed therewith. The first electrical contact pad is disposed between the outer periphery of the TCP and the outer lead, and the second electrical contact pad is disposed between the inner lead and the outer lead. The method involves removing the outer leads, mounting the TCP onto a test device, and aligning the test device with at least one alignment hole on the TCP such that each of the second electrical contact pads is aligned with an electrical contact bump on the test device.

In another embodiment, the present invention includes a method for testing a TCP having a tape with a plurality of leads. Each of said plurality of leads has an inner lead and an outer lead and only one test pad integrally formed therewith and disposed between the inner and outer leads. The method involves removing the outer leads, mounting the TCP onto a test device, and aligning the test device with at least one alignment hole on the TCP such that each test pad is aligned with an electrical contact bump on the test device.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

An apparatus and method that provides an improved interface for testing the IC device on a TCP after the TCP has been removed from a PCB is described. In the following description, numerous specific details are set forth such as material types, dimensions, processing steps, etc., in order to provide a thorough understanding of the present invention. However, it will be obvious to one of skill in the art that the invention may be practiced without these specific details. In other instances, well known elements and processing techniques have not been shown in particular detail in order to avoid unnecessarily obscuring the present invention.

Figure 1:
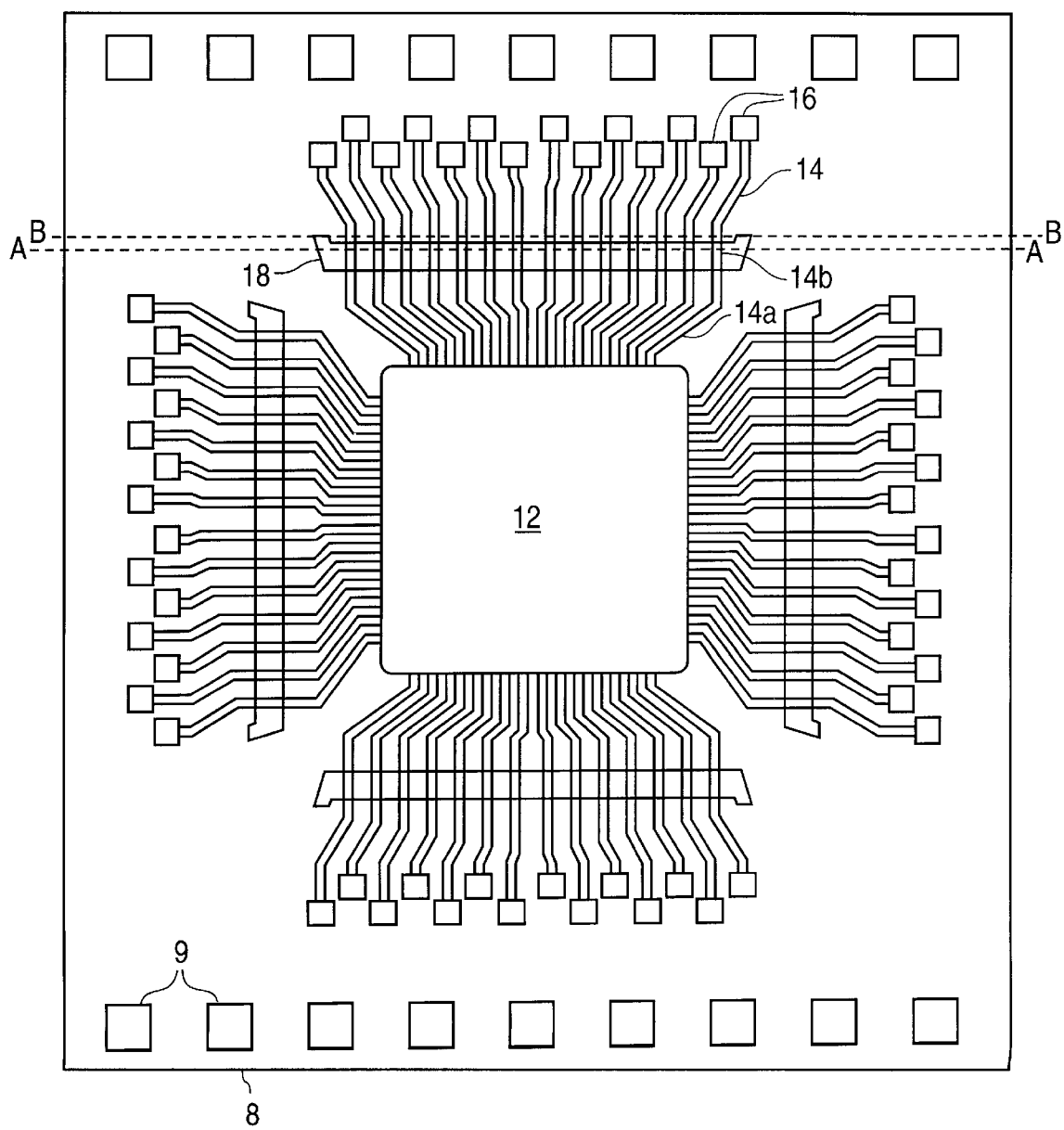
FIG. 1 illustrates the backside of a prior art TCP.
Figure 2A:
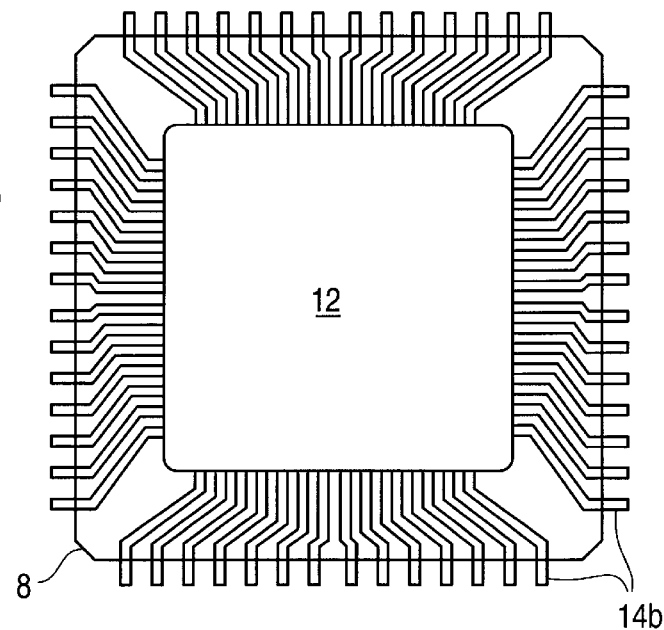
FIG. 2a illustrates the prior art TCP of FIG. 1 trimmed along lines A—A.
Figure 2B:
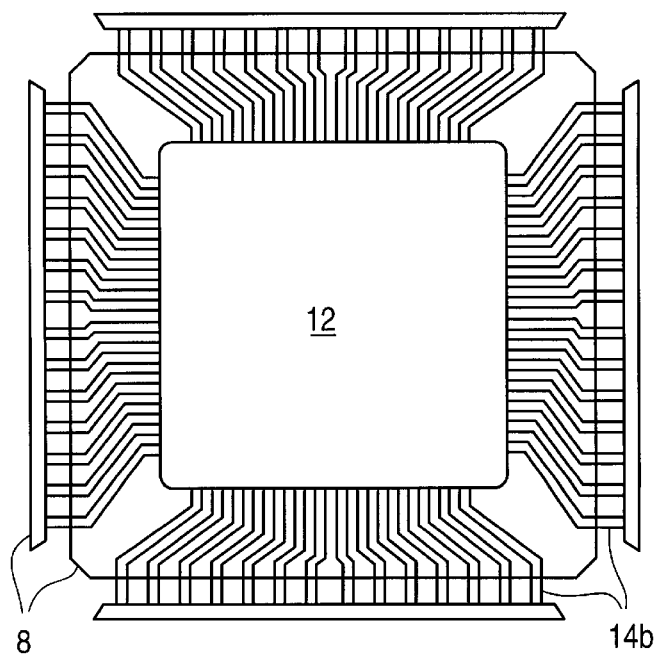
FIG. 2b illustrates the prior art TCP of FIG. 1 trimmed along lines B—B.
Figure 3:
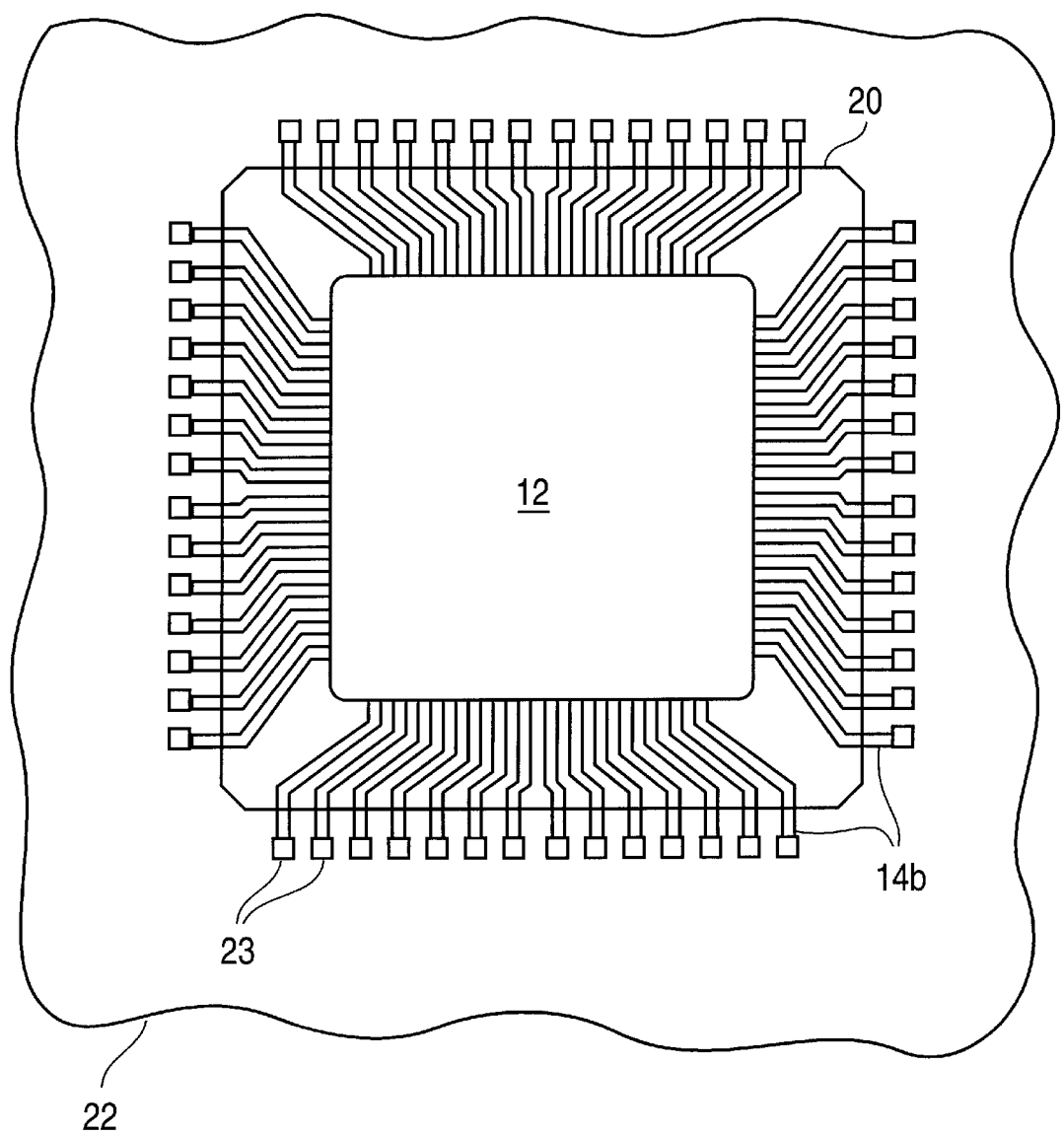
FIG. 3 illustrates the prior art TCP of FIG. 2a mounted to a PCB.
Figure 4:
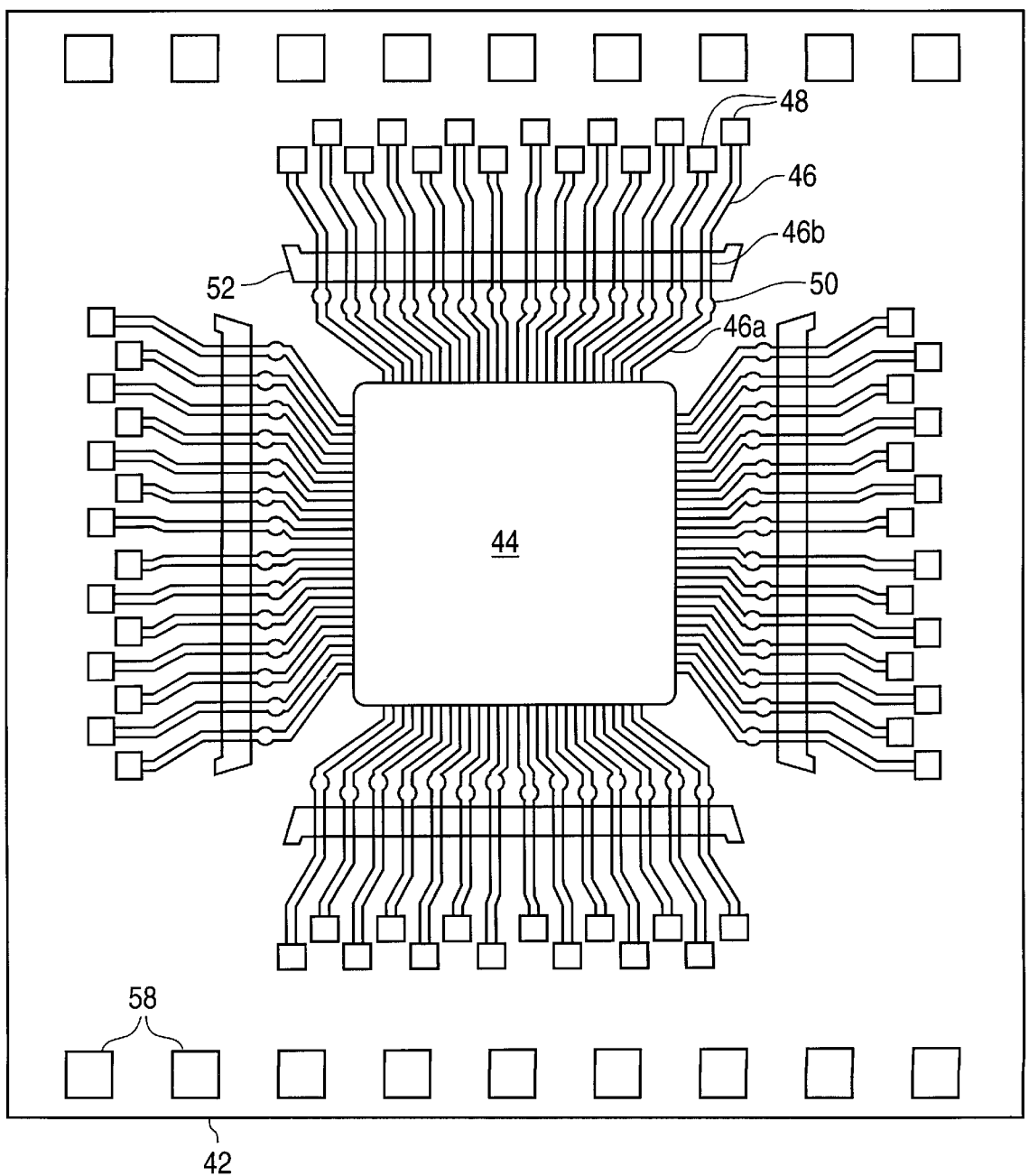
FIG. 4 illustrates a top view of one embodiment of the present invention.

Referring now to FIG. 4, one embodiment of the present invention is shown. FIG. 4 shows a TCP 40 that couples an IC device 44 to a substrate (not shown). Although an IC device 44 is described and shown, it is to be understood that the TCP of the present invention may contain other electrical devices.

As illustrated in FIG. 4, TCP 40 has a plurality of conductive leads 46 attached to a dielectric tape 42. Each conductive lead 46 possesses an inner lead 46a and an outer lead 46b. Inner leads 46a are attached to IC device 44. The inner lead bonding (ILB) of leads 46a to IC device 44 normally consists of a thermocompression bonding step in which a hot thermode applies pressure between the TCP leads and the chip interconnection structure. Note, however, that any of a variety of other bonding techniques that are commonly known in the art may also be used.

With continuing reference to FIG. 4, outer leads 46b are shown extending out to a first set of test pads 48 located at the outer edges of tape 42. Test pads 48 are used to test the performance of IC device 44 before the TCP is mounted to a substrate. Outer leads 46b are exposed by windows 52 in tape 42. The windows 52 and leads 46 are typically constructed to create 4 groups of outer lead regions located in a rectangular pattern that corresponds to the rectangular pattern of the IC device interconnection structure.

As previously discussed, the fine pitch lead devices being fabricated today have made it increasingly more difficult to test their performance after they have been attached to and subsequently removed from a PCB. To overcome the problems associated with the prior art methods of testing these devices, the present invention provides a second set of test pads 50 that are positioned between the IC device 44 and outer leads 46b of TCP 40. By providing a second set of test pads 50, the present invention obviates the need to solder each TCP lead to a corresponding pad on the surface of interposer circuit board when testing the performance of a TCP device that has been removed from a substrate.

Figure 5:
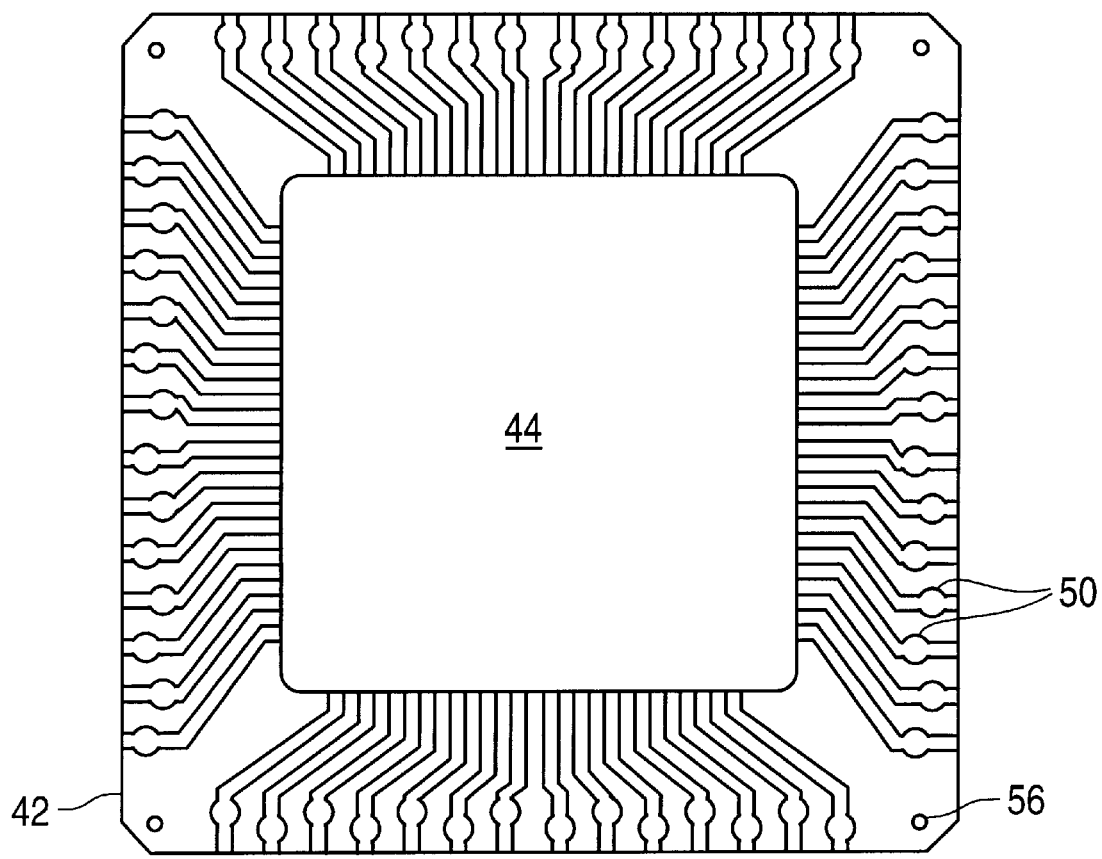
FIG. 5 illustrates the TCP of FIG. 4 with the leads trimmed.

To perform a failure analysis test of an IC device that is housed within a TCP of the present invention the outer leads 46b are trimmed from the TCP as depicted in FIG. 5. Once the leads are removed from the TCP, the TCP is then mounted onto a test device that contains an electrical interface structure that is able to make intimate contact with test pads 50. For example, a reusable socket device containing gold bumps that correspond with test pads 50 may be used. As shown in FIG. 5, the present invention may also contain alignment holes 56 to facilitate the alignment of test pads 50 with the corresponding electrical interface structure of a test device (not shown).

Conductive leads 46 and test pads 48 and 50 are formed by laminating a polyimide carrier film (tape) with a copper foil. The copper foil is generally laminated onto the polyimide using an epoxy-based adhesive. A photolithographic technique is used to create the specific pattern of metal leads and test pads. Once the tape metal pattern has been created, the exposed copper is plated with a nickel barrier metal and a gold outer plating. It should be understood, however, that leads and test pads comprising copper with nickel and gold plating is not essential to the implementation of the present invention, nor is the invention limited to a TCP having only three metal layers. A single metal layer or any combination of multi-metal layers capable of providing the same electrical and solderability characteristics may also be used.

In one embodiment the copper, nickel and gold layers have thickness of approximately 0.035, 0.006 and 0.006 millimeters, respectively. The width and pitch of leads 46 will vary depending upon the design characteristics of IC device 44 and tape 42. As an example, a 24 millimeter body size TCP containing a 320 lead IC device will typically require a lead width and pitch of approximately 0.1 and 0.25 millimeters, respectively. As the width and pitch of leads 46 vary, so will the shape, size and arrangement of test pads 48 and 50. In the example above, test pads 48 and 50, as depicted in FIGS. 4 and 5, will typically have widths and diameters of approximately 0.6 and 0.2 millimeters, respectively. Although FIGS. 4 and 5 show test pads 48 and 50 possessing a rectangular and circular shapes, it should be understood that the test pads may take other shapes and may be organized in different configurations in order to optimize the available contact area of the test pads.

Figure 6:
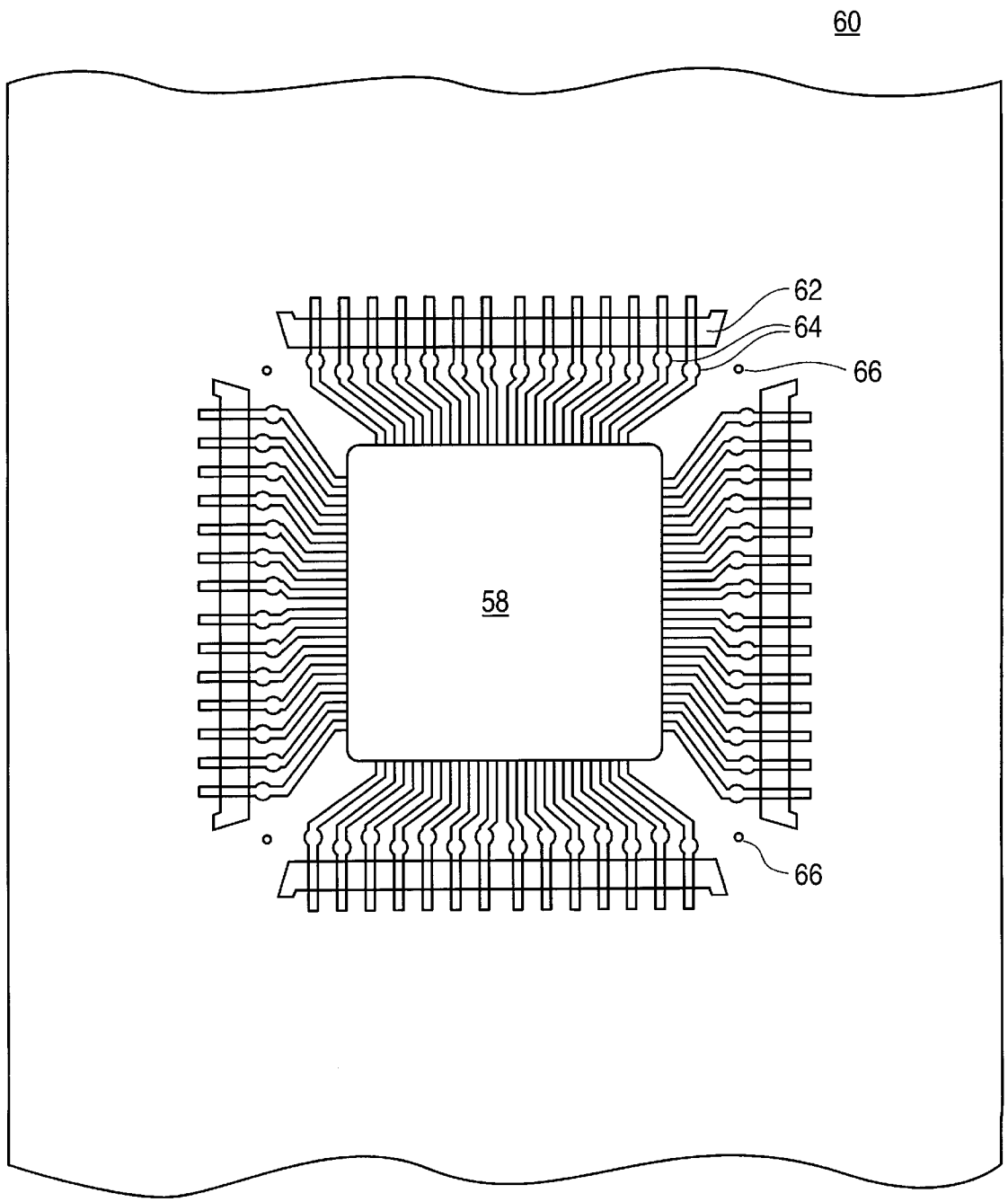
FIG. 6 illustrates a top view of another embodiment of the present invention.

FIG. 6 shows another embodiment of the present invention having only one set of test pads 64 that are located between IC device 58 and outer leads 62. In this embodiment test pads 64 may be used to test both the performance of IC device 58 after the TCP has been assembled and later during failure analysis testing. As shown in FIG. 6, TCP 60 contains alignment holes 66 to facilitate the alignment of test pads 64 with the corresponding electrical interface structure of a test device (not shown).

As previously discussed, the ever increasing clocking frequency of semiconductor devices has made it more difficult to test IC devices because of the switching noise that results from the high-speed switching operations of the IC device. By providing a single set of test pads 64 that are located in close proximity to IC device 58, the present invention provides a means for testing high clock frequency devices wherein the impedance between test pads 64 and IC device 58 is minimized. Hence, the electrical switching noise resulting from high-speed switching operations of IC device 58 is also reduced by the present invention.

Thus, an apparatus and method for providing an improved interface for testing an IC device on a TCP is described. Although many alternations and modifications to the present invention will no doubt become apparent to the person of ordinary skill in the art after having read the foregoing description, it is to be understood that the particular embodiments shown and described by way of illustration are in no way intended to be limiting. It is further understood that the relative dimensions, geometric shapes, materials and process parameters set forth within the specification are exemplary of the disclosed embodiments only. Other embodiments may utilize different dimensions, shapes, materials, and process steps, etc., to achieve substantially the same results.

What is claimed is:

1. A method for testing a tape carrier package, said method comprising:
 a) providing a tape carrier package having:
  a tape in which a plurality of leads composed of an electrically conductive foil are formed on said tape, each of said plurality of leads comprising an inner lead and an outer lead wherein said inner lead is connected to an integrated circuit device and said tape carrier package has an outer periphery that extends beyond the outer lead;
  a first array of electrical contact pads integrally formed with said plurality of leads, each electrical contact pad of said first array of electrical contact pads being electrically connected with a corresponding one of said plurality of leads, each electrical contact pad of said first array of electrical contact pads being disposed between the outer periphery of said tape carrier package and said outer lead;
  a second array of electrical contact pads integrally formed with said plurality of leads, each electrical contact pad of said second array of electrical contact pads being electrically connected with a corresponding one of said plurality of leads, each electrical contact pad of said second array of electrical contact pads being disposed between said inner and outer leads; and
  at least one alignment hole in said tape;
 b) removing said outer leads;
 c) mounting said tape carrier package onto a test device containing a plurality of electrical contact bumps corresponding to said second array of electrical contact pads; and
 d) aligning said test device with at least one alignment hole on said tape carrier package such that each of said electrical contact pads of said second array is aligned with one of said electrical contact bumps.

* * * * *